(12) United States Patent
Bavisi et al.

(10) Patent No.: US 7,772,124 B2
(45) Date of Patent: Aug. 10, 2010

(54) METHOD OF MANUFACTURING A THROUGH-SILICON-VIA ON-CHIP PASSIVE MMW BANDPASS FILTER

(75) Inventors: Amit Bavisi, Tempe, AZ (US); Hanyi Ding, Essex Junction, VT (US); Guoan Wang, South Burlington, VT (US); Wayne H. Woods, Jr., Burlington, VT (US); Jiansheng Xu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 12/140,439

(22) Filed: Jun. 17, 2008

(65) Prior Publication Data

US 2009/0311841 A1    Dec. 17, 2009

(51) Int. Cl.
   *H01L 21/311* (2006.01)
(52) U.S. Cl. .................... 438/700; 438/637; 438/687; 257/E21.17; 257/E21.006; 257/E21.058; 257/E21.229; 257/E21.267; 257/E21.278; 257/E21.545
(58) Field of Classification Search ............. 438/637, 438/700, 618, 675, 683, 687, 688, 723, 756, 438/753, 680, 692; 257/E21.17, E21.006, 257/E21.058, E21.229, E21.267, E21.278, 257/E21.545
See application file for complete search history.

(56) References Cited

U.S. PATENT DOCUMENTS

| 6,137,383 | A  | * | 10/2000 | De Lillo ................ 333/210 |
| 6,617,943 | B1 | * | 9/2003  | Fazelpour ............. 333/204 |
| 6,765,458 | B2 |   | 7/2004  | Yamaguchi |
| 7,142,074 | B2 |   | 11/2006 | Kim et al. |
| 7,170,373 | B2 |   | 1/2007  | Ito et al. |
| 2007/0042563 | A1 | * | 2/2007 | Wang et al. ........... 438/424 |

* cited by examiner

*Primary Examiner*—David Nhu
(74) *Attorney, Agent, or Firm*—Anthony J. Canale; Roberts Mlotkowski Safran & Cole, P.C.

(57) ABSTRACT

A method for forming a through-silicon via bandpass filter includes forming a substrate comprising a silicon layer and providing a metal layer on a bottom side of the silicon layer. Additionally, the method includes providing a dielectric layer on a top side of the silicon layer and forming a top-side interconnect of the through-silicon via bandpass filter on a surface of the dielectric layer. Further, the method includes forming a plurality of contacts in the dielectric layer in contact with the top-side interconnect and forming a plurality through-silicon vias through the substrate and in contact with the plurality of contacts, respectively, and the metal layer.

20 Claims, 10 Drawing Sheets

METHOD OF MANUFACTURING A THROUGH-SILICON-VIA ON-CHIP PASSIVE MMW BANDPASS FILTER

CROSS REFERENCE TO RELATED APPLICATIONS

This application is related to U.S. Ser. No. 12/140,364 filed on the same day and currently pending.

FIELD OF THE INVENTION

The present invention generally relates to a method of manufacturing a bandpass filter, and more specifically, a method for manufacturing a thru-silicon-via (TSV) on-chip passive millimeter wave (MMW) bandpass filter.

BACKGROUND

The strategy of enhancing the function of an integrated circuit by reducing its critical dimensions, known as scaling, has been a key to faster performance and more densely packed integrated circuits. However, as semiconductor devices continue to become smaller in size, the devices must continue to be able to be made with reduced dimensions and still function at the required specifications. That is, the growing demand for increasingly smaller and thus more cost effective semiconductor devices, e.g., with large memory capacities, has pushed the development of miniaturized structures. But such miniaturization has its limits. For example, the size of the capacitor becomes increasingly larger with regard to the circuit itself, thus taking up considerable chip real estate.

Additionally, space or area on a semiconductor device is a valuable commodity. However, the demand for increasingly smaller, and thus more cost effective, semiconductor devices reduces the available area of the semiconductor device for necessary components of the semiconductor device.

Millimeter wave (MMW) circuits and systems require passive filters for their operation. MMW frequencies range from approximately 30 gigahertz to approximately 300 gigahertz. Conventionally, passive filter structures are formed on the surface of a semiconductor circuit in order to provide the required passive filtering. However, these passive filters formed on the surface of the semiconductor circuit often take up large amounts of circuit surface area to deliver adequate circuit performance. By taking up large amounts of silicon area, these passive filters occupy valuable device space that could be utilized for other purposes.

Accordingly, there exists a need in the art to overcome the deficiencies and limitations described hereinabove.

SUMMARY

In a first aspect of the invention, a method for forming a through-silicon via bandpass filter comprises forming a substrate comprising a silicon layer and providing a metal layer on a bottom side of the silicon layer. Further, the method comprises providing a dielectric layer on a top side of the silicon layer. Additionally, the method comprises forming a top-side interconnect of the through-silicon via bandpass filter on a surface of the dielectric layer and forming a plurality of contacts in the dielectric layer in contact with the top-side interconnect. Further, the method comprises forming a plurality of through-silicon vias through the substrate and in contact with the plurality of contacts, respectively, and the metal layer.

In another aspect of the invention, a method for forming a filter comprises forming a first and a second through-silicon via in a substrate, wherein the first and the second through-silicon vias are spaced from one another by a distance $D_{sep}$. Additionally, the method comprises depositing a dielectric layer on the substrate and forming a first contact and a second contact in the dielectric layer and in contact with the first and the second through-silicon vias, respectively. Further, the method comprises forming a first inner portion and a second inner portion on the dielectric layer in contact with the first contact and the second contact, respectively, wherein the first inner portion and the second inner portion each have a length $L_{top}$. Moreover, the method comprises forming a first outer portion and a second outer portion in line with the first inner portion and the second inner portion and respectively spaced from the first inner portion and the second inner portion by a distance $D_{gap}$ and depositing a metal layer on a bottom side of the substrate, wherein the first and the second through-silicon vias are in contact with the metal layer.

In a further aspect of the invention, a method for forming a filter comprises forming a first and a second through-silicon via in a substrate having a thickness between approximately 145 μm and 300 μm, wherein the first and the second through-silicon vias are spaced from one another by a distance $D_{sep}$ of between approximately 5 μm and 20 μm. Additionally, the method comprises depositing a dielectric layer on the substrate and forming a first contact and a second contact in the dielectric layer and in contact with the first and the second through-silicon vias, respectively. Further, the method comprises forming a first inner portion and a second inner portion on the dielectric layer in contact with the first contact and the second contact, respectively, wherein the first inner portion and the second inner portion each have a length $L_{top}$ of between approximately 100 μm and 300 μm. Also, the method comprises forming a first outer portion and a second outer portion in line with the first inner portion and the second inner portion and respectively spaced from the first inner portion and the second inner portion by a distance $D_{gap}$ of between approximately 0.1 μm and 1.5 μm. Additionally, the method comprises depositing a metal layer on a bottom side of the substrate, wherein the first and the second through-silicon vias are in contact with the metal layer. Moreover, at least one of the distance $D_{gap}$ and the length $L_{top}$ is selected to target a filter frequency of between approximately 60 gigahertz and 94 gigahertz.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a method of manufacturing a bandpass filter, and more specifically, a method for manufacturing a thru-silicon-via (TSV) on-chip passive millimeter wave (MMW) bandpass filter. The present invention comprises a method of manufacture of an on-chip passive bandpass filter for MMW applications that includes a pair of electrically-coupled (capacitively and inductively) thru-silicon vias (TSVs). The present invention provides an on-chip solution to the problem of excessive device space usage by extending elements of the bandpass filter into the silicon using through-silicon-vias (TSV), which extend deep into the silicon, and thus do not occupy a large area footprint on the top-side of the chip. By implementing the present invention, the size of on-chip MMW circuits may be reduced because the footprint of the bandpass filter is smaller than what would be needed to implement the equivalent filter in the above-silicon metal-dielectric interconnect stack. The present invention has MMW applications such as, for example, radar applications, medical imaging applications, and communication applications, amongst other applications.

In operation, the present invention functions as a bandpass filter. The bandpass filter is capacitively coupled (edge-to-edge) at input and output lines of the circuit. As such, there is no DC connection between the input and output lines. Further, the bandpass filter of the present invention includes two through-silicon-vias (TSV). One TSV is capacitively coupled/connected to the input line of the circuit and the other TSV is capacitively coupled/connected to the output line of the circuit. Both TSVs are connected to ground with a backside-of-the-silicon metal plane. The width and spacing of the TSVs determine the capacitance and inductance (self and mutual coupling) of the two TSVs and, consequently, the characteristics of the bandpass filter's frequency response. The electrical coupling is greatly improved due to the two TSVs due to the face-to-face coupling. Moreover, the size of the filter is greatly reduced due to the 3-D structure (taking advantage of the z-direction).

In embodiments, the bandpass filter may be targeted for a particular frequency. For example, an electromagnetic simulation may be used to determine the dimensions of the TSVs necessary to target the particular frequency. Moreover, a kit or field solver software may be used to implement the TSV bandpass filter.

Figure 1:
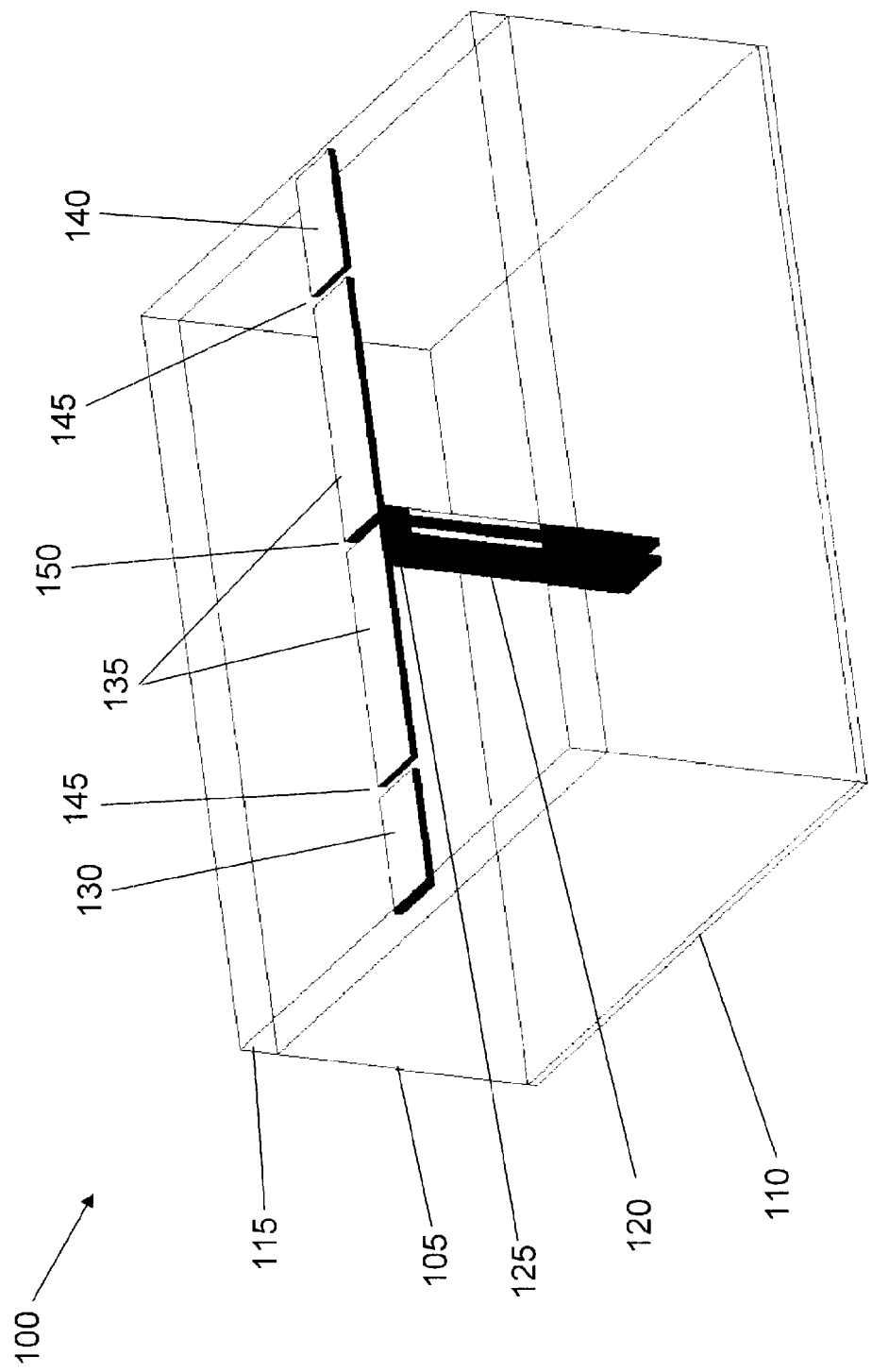
FIG. 1 shows an exemplary perspective view of a through-silicon-via bandpass filter in accordance with the invention.

FIG. 1 shows a perspective view of an exemplary embodiment of a through-silicon-via (TSV) on-chip passive MMW bandpass filter 100. As shown in FIG. 1, the bandpass filter 100 includes a silicon substrate 105 with a metal layer 110 provided below the silicon substrate 105. In embodiments, the silicon substrate 105 may have a thickness of between approximately 145 µm and 300 µm, with other thicknesses contemplated by the invention. The metal layer 110 is a ground plane metallization and may be composed of, for example, tungsten, copper or aluminum, amongst other metals. A dielectric layer 115, for example, an oxide layer, e.g., $SiO_2$, or low-k material layer (e.g., approximately 3.6) is formed above the silicon substrate 105. In embodiments, the thickness of the dielectric layer 115 may be technology dependent. Conventional wiring for the chip (not shown) may be located within or atop the dielectric layer 115. For example, metallization layers (e.g., M1, M2 and M3) may be formed above the active device layer that is at the interface of the silicon substrate 105 and the dielectric layer 115 to form, e.g., a passive device.

As further shown in FIG. 1, two through-silicon-vias 120 are formed in trenches etched through the silicon layer 105. Additionally, two contact layers 125 are formed in trenches etched in the dielectric layer 115 and contact the two through-silicon-vias 120. In embodiments, the through-silicon-vias 120 and the two contact layers 125 may comprise a metal, e.g., copper or tungsten, amongst other metals. Additionally, the through-silicon-vias 120 and the two contact layers 125 may be formed directly in contact with the silicon substrate 105 and the dielectric layer 115, respectively. However, in embodiments, an oxide liner may optionally be formed between the silicon substrate 105 and the through-silicon-vias 120. On the back side of the structure, the two through-silicon-vias 120 are in contact with the metal layer 110, which is grounded on the backside of the silicon substrate 105.

Additionally, as shown in FIG. 1, the through-silicon-via bandpass filter 100 includes a top-side interconnect comprising two outer portions 130 and 140 and two inner portions 135. In embodiments, the two outer portions 130 and 140 and two inner portions 135 may be formed of, for example, aluminum or copper. The outer portion 130 forms an input port for the bandpass filter 100 and the outer portion 140 forms an output port for the bandpass filter 100. The inner portions 135 are in contact with the two contact layers 125, respectively, which in turn are in contact with the through-silicon-vias 120.

As shown in FIG. 1, the two outer portions 130 and 140 are respectively spaced from the two inner portions 135 by gaps 145. The gaps 145 in the top-side interconnect form capacitors, as discussed further below, which provide DC isolation. That is, the gaps 145 only allow high frequency current to pass through the bandpass filter 100. As discussed further below, the gaps 145 do not contribute strongly to the filter characteristics of the bandpass filter 100.

The inner portions 135 are separated from one another to a same extent as a separation distance between the through-silicon-vias 120. In embodiments, the separation distance may be between approximately 5 µm and 20 µm, with other separation distances contemplated by the invention. As explained further below, this separation distance between the inner portions 135 and the between the through-silicon-vias 120 form an additional capacitor. Moreover, as explained further below, each inner portion 135 forms an inductor and each combination of the through-silicon-via 120 and the contact 125 forms an inductor.

Figure 2:
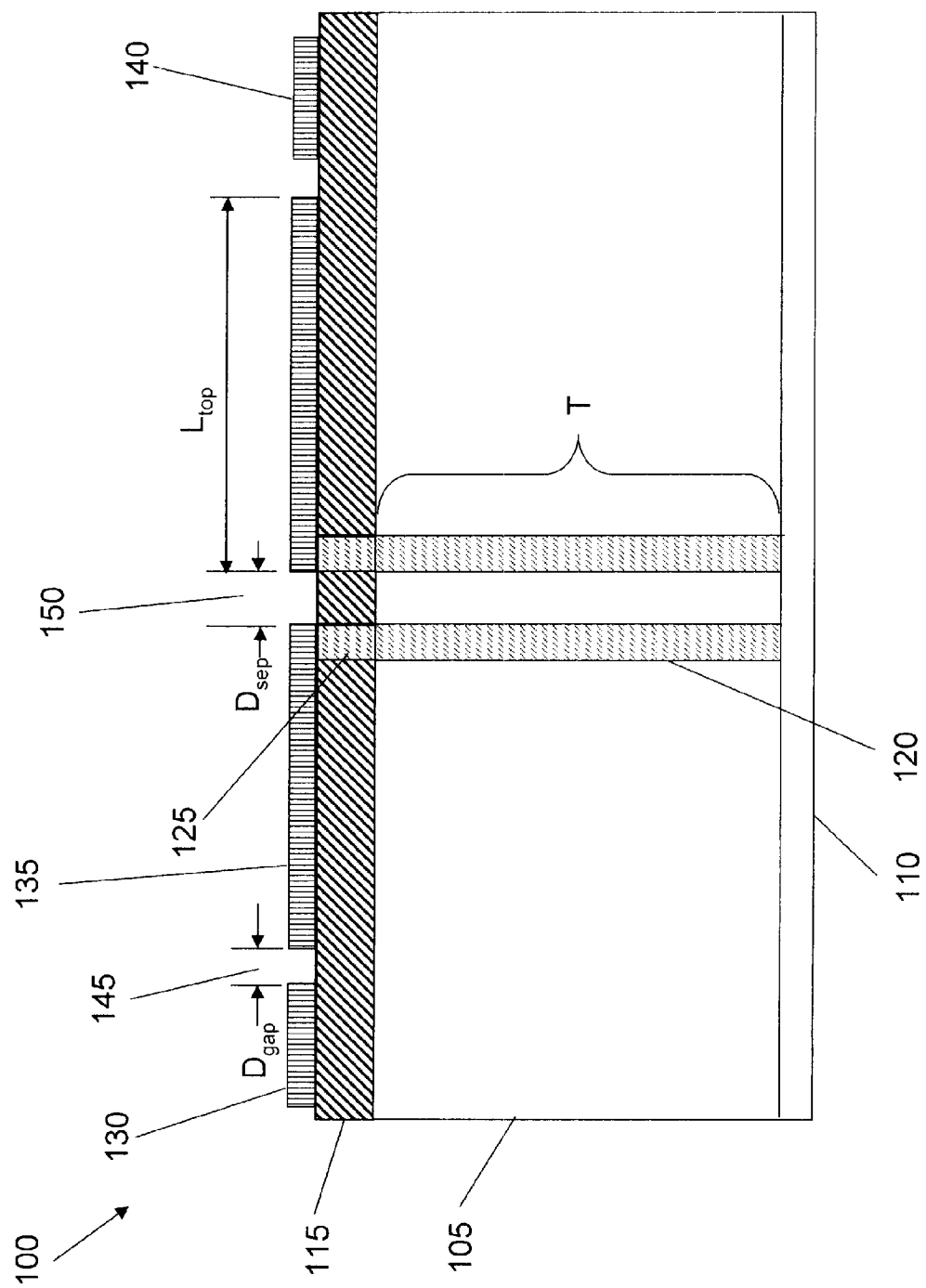
FIG. 2 shows an exemplary cross section view of the through-silicon-via bandpass filter in accordance with the invention.

FIG. 2 shows a cross section view of the exemplary bandpass filter 100. As shown in FIG. 2, the inner portions 135 have a length $L_{top}$. In embodiments, the length $L_{top}$ may be between approximately 100 µm and 300 µm, with other lengths contemplated by the invention. Additionally, in embodiments, the length $L_{top}$ may be varied to alter the filter characteristics, e.g., an S-parameter loss, of the bandpass filter 100. As discussed further below, an S-parameter (or scattering parameter) is a property describing the electrical behavior of linear electrical networks when undergoing various steady state stimuli by small signals. For example, increasing the length $L_{top}$ may result in a greater S-parameter loss. As discussed further below, in embodiments, it may be desirable to maintain an S-parameter loss above −5 dB.

Additionally, as shown in FIG. 2, the two inner portions 135 of the top-side interconnect, the two contact layers 125 and the two through-silicon-vias 120 are each respectively separated from one another by a distance $D_{sep}$. In embodiments, the distance $D_{sep}$ may be between approximately 5 µm and 20 µm, with other distances contemplated by the invention. Additionally, in embodiments, the distance $D_{sep}$ may be varied to alter the filter characteristics of the bandpass filter 100. For example, increasing the distance $D_{sep}$ increases the amount of silicon between the TSVs 120, and consequently, may result in a greater S-parameter loss, as silicon is a lossy dielectric. Also, each of two inner portions 135 may be spaced from the outer portion 130 and the outer portion 140, respectively, by a distance $D_{gap}$. In embodiments, the distance $D_{gap}$ may be between approximately 0.1 μm and 1.5 μm, with other distances contemplated by the invention. As discussed above, the distance $D_{gap}$ may be varied to allow, e.g., only high frequency current to pass through the bandpass filter.

The two through-silicon-vias 120 have a depth T that is substantially equal to the thickness of the silicon substrate 105. In embodiments, the depth T may be between approximately 145 μm and 300 μm, with other depths contemplated by the invention. Additionally, as shown in FIG. 2, the two contact layers 125 have a depth that is substantially equal to the thickness of the dielectric layer 115. As discussed above, in embodiments, the thickness of the dielectric layer 115, and consequently, the depth of the two contact layers 125, may be technology dependent.

Figure 3:
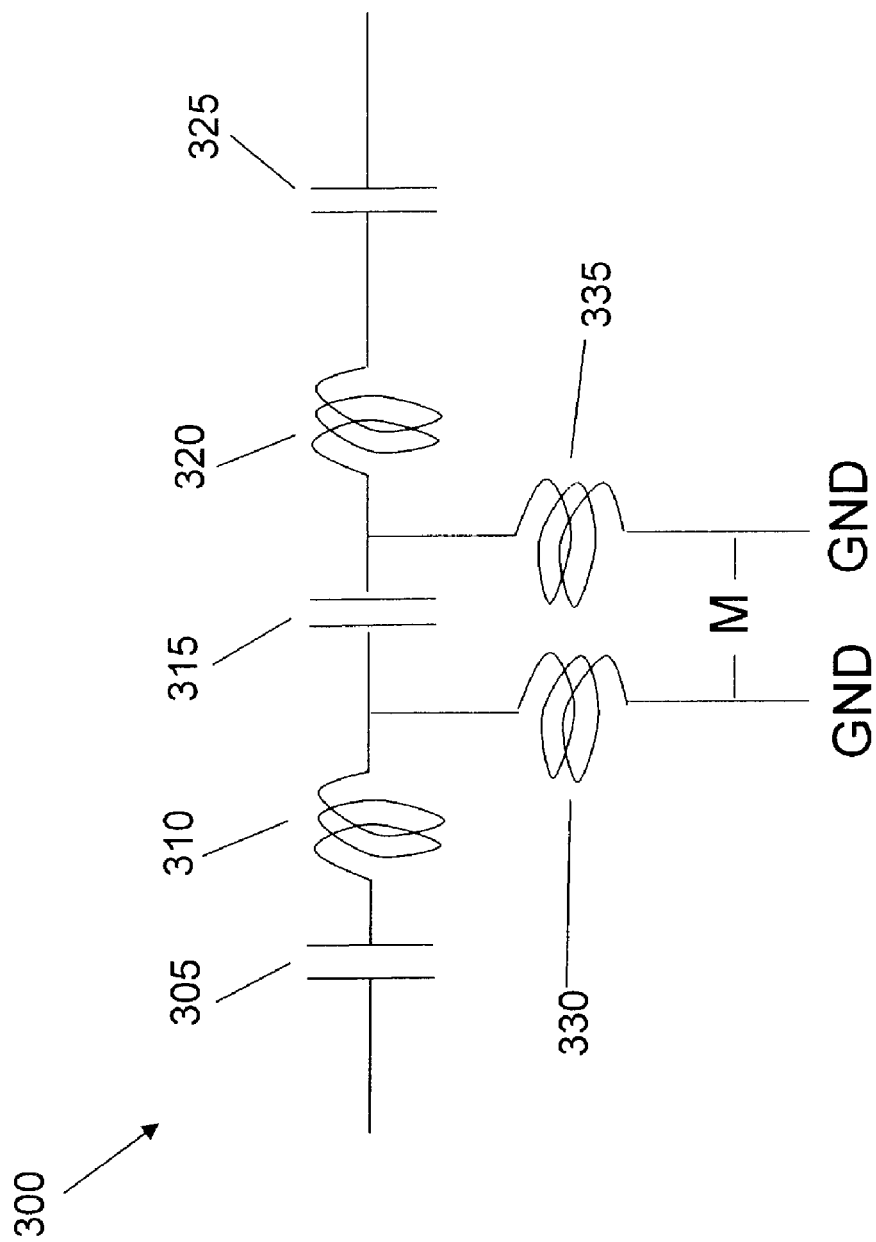
FIG. 3 shows a circuit diagram of the exemplary through-silicon-via bandpass filter in accordance with the invention.

FIG. 3 shows a basic circuit-level depiction 300 of the exemplary TSV bandpass filter 100 shown in FIGS. 1 and 2. As shown in FIG. 3, left and right capacitors 305 and 325, respectively, function as a DC block. As should be understood, the left capacitor 305 is formed by the gap 145 between the outer portion 130 and adjacent the inner portion 135 and the right capacitor 325 is formed by the gap 145 between the outer portion 140 and adjacent the inner portion 135, as shown in FIG. 2.

A lateral inductor 310 is formed by the inner portion 135 and a lateral inductor 320 is formed by the other inner portion 135, as shown in FIG. 2. According to an aspect of the invention, the lateral inductors 310 and 320 may be used to set or tune a frequency upper limit.

Vertical inductors 330 and 335 are respectively formed by the combination of the through-silicon-vias 120 and the contact layers 125. As described above, in embodiments, there may optionally be a dielectric layer formed between the through-silicon-via 120 and the surrounding silicon substrate 105. Additionally, the middle capacitor 315 is formed by the separation 150 between the inner portions 135. The two vertical inductors 330 and 335 and the middle capacitor 315 may be used to set or tune a frequency lower limit. Additionally, the middle capacitor 315 and the mutual coupling between the two vertical inductors 330 and 335 may be used to set an insertion loss. Further, as shown in FIG. 3, M represents the mutual inductance between the conductor paths and GND represents the termination at the grounded metal layer.

Figure 4:
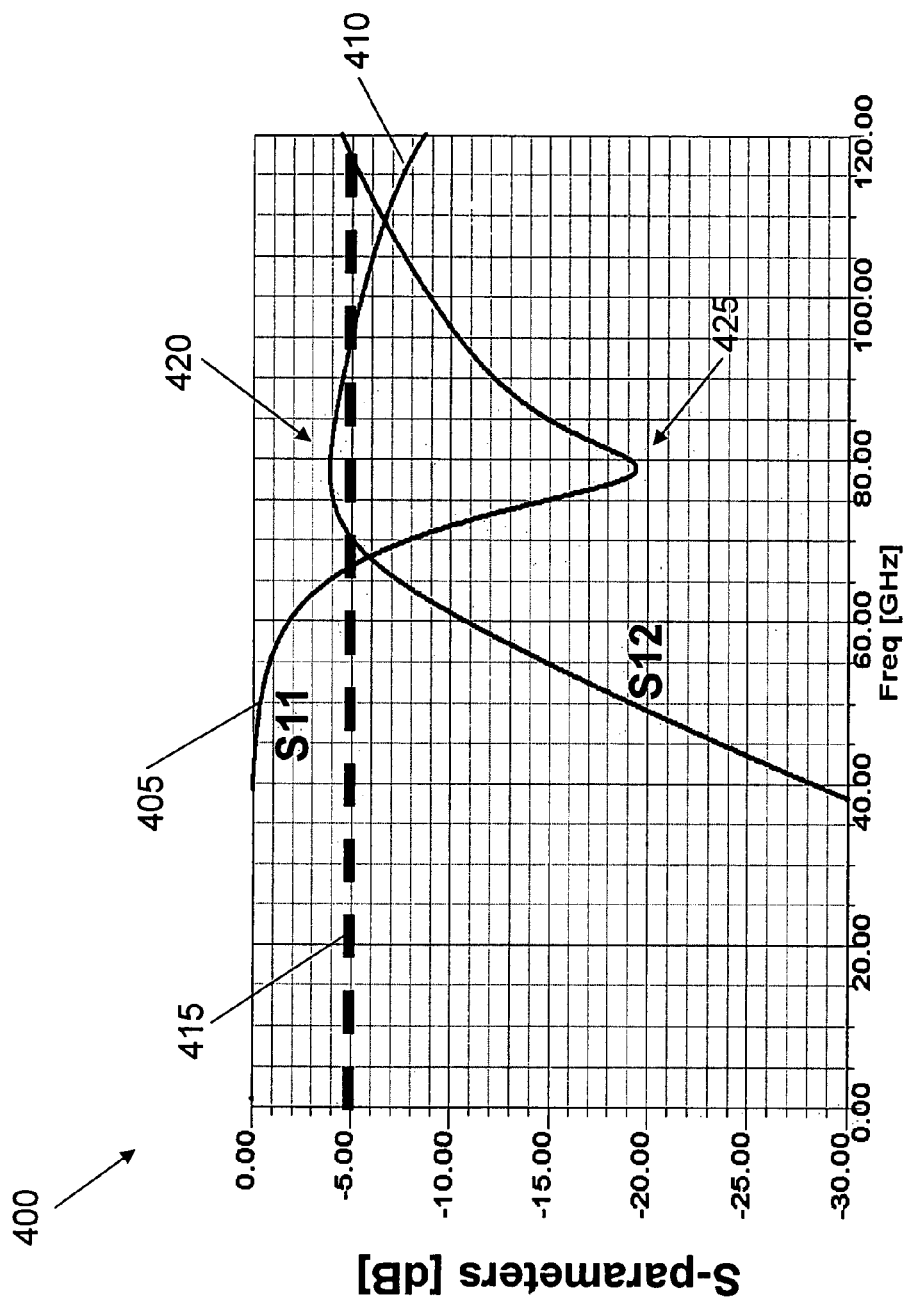
FIGS. 4 and 5 show S-parameter filter characteristics for two exemplary through-silicon-via bandpass filters in accordance with aspects of the invention.
Figure 5:
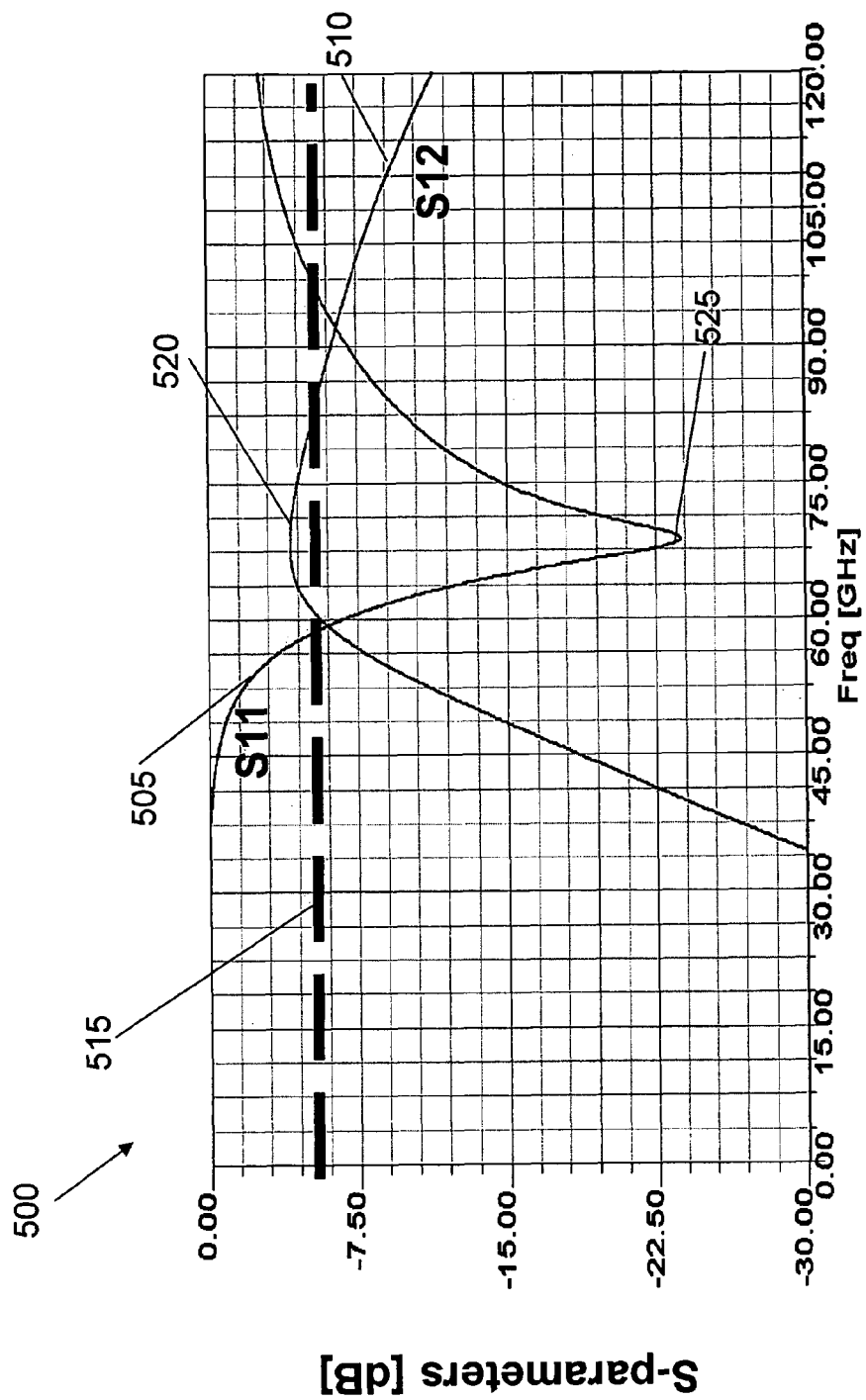

FIGS. 4 and 5 show S-parameter filter characteristics for two exemplary through-silicon-via bandpass filters in accordance with the invention. S-parameters or scattering parameters are properties used in electrical engineering, electronics engineering, and communication systems engineering describing the electrical behavior of linear electrical networks when undergoing various steady state stimuli by small signals. In the context of S-parameters, scattering refers to the way in which the traveling currents and voltages in a transmission line are affected when they meet a discontinuity caused by the insertion of a network into the transmission line. Although applicable at any frequency, S-parameters are mostly used for networks operating at radio frequency (RF) and microwave frequencies where signal power and energy considerations are more easily quantified than currents and voltages. An electrical network to be described by S-parameters may have any number of ports. Ports are the points at which electrical currents either enter or exit the network. The S-parameter magnitude may be expressed in linear form or logarithmic form. When expressed in logarithmic form, magnitude has the "dimensionless unit" of decibels. Thus, as shown in FIGS. 4 and 5, the S-parameter filter characteristics show a plot of the frequency measured in gigahertz versus S-parameter measured in decibels.

Specifically, FIG. 4 shows S-parameter filter characteristics results 400 of an exemplary through-silicon-via bandpass filter 100, in which the through-silicon-vias 120 have a width of 25 μm and a thickness of 3 μm. Moreover, the through-silicon-via bandpass filter 100 has a separation distance $D_{sep}$ of 5 μm, a length $L_{top}$ of 150 μm and gap distances $D_{gap}$ of 0.5 μm.

As shown in FIG. 4, the S-parameter filter characteristics results 400 indicate an input port voltage reflection coefficient 405 (S11) and a reverse voltage gain 410 (S12) over a range of frequencies. The input port voltage reflection coefficient 405 (S11) indicates a loss of the power input due to reflection. Additionally, the reverse voltage gain 410 (S12) indicates the amount of electromagnetic energy that travels through the bandpass filter 100 from the input port to the output port. The reverse voltage gain will always be negative. Additionally, a reference line 415 is shown at approximately −5 dBs. As discussed further below, the reverse voltage gain 410 (S12) should be above the reference line 415 at the targeted filter frequency for the bandpass filter to be deemed operational.

As shown in FIG. 4, the S-parameter filter characteristics results 400 show a minimum value for the input port voltage reflection coefficient 405 (S11) at point 425 of about 77 gigahertz. Additionally, the reverse voltage gain 410 (S12) is above the −5 dB reference line 415 at point 420. Thus, the S-parameter filter characteristics results 400 indicate that the exemplary bandpass filter 100 would be ideally suited for a 77 GHz frequency node. A 77 GHz frequency node application may include, for example, automobile collision avoidance radar applications.

FIG. 5 shows S-parameter filter characteristics results 500 of an exemplary through-silicon-via bandpass filter 100, in which the through-silicon-vias 120 have a width of 25 μm and a thickness of 3 μm. Moreover, the through-silicon-via bandpass filter 100 has a separation distance $D_{sep}$ of 5 μm, a length $L_{top}$ of 200 μm and gap distances $D_{gap}$ of 0.5 μm. Thus, as compared to the exemplary bandpass filter whose S-parameter results are shown in FIG. 4, the exemplary bandpass filter whose S-parameter results are shown in FIG. 5 has a larger $L_{top}$ value. As a result of the larger $L_{top}$ dimension, according to an aspect of the invention, the filter characteristics of the bandpass filter 100 have been altered.

Specifically, as shown in FIG. 5, the S-parameter filter characteristics results 500 indicate a minimum value for the input port voltage reflection coefficient 505 (S11) at point 525 of about 70 gigahertz. Additionally, the reverse voltage gain 510 (S12) is above the −5 dB reference line 515 at point 520. Thus, the S-parameter filter characteristics results 500 indicate that the exemplary bandpass filter whose S-parameter results are shown in FIG. 5 would be ideally suited for a 70 gigahertz frequency node.

Thus, as can be observed, the bandpass filter of the present invention may be used for MMW circuits. The operation range of the bandpass filter is approximately 60 gigahertz-94 gigahertz. However, in embodiments, this frequency can be tuned by changing, e.g., the dimensions and/or locations of the TSVs 120, for example, increasing the distance $D_{sep}$ to form the TSVs 120 farther apart or at a greater distance and/or altering the distance $L_{top}$, amongst other alterations. Thus, according to an aspect of the invention, the operational range of the bandpass filter 100 may be tailored such that it is ideally suited for, e.g., the 60 gigahertz frequency node (e.g., electronic wireless communication applications, short distance high definition (HD) TV home broadcasting, etc. . . . ), the 77 gigahertz frequency node (e.g., automobile collision avoidance radar applications), and/or the 94 gigahertz frequency node (medical imaging applications), with other frequency nodes contemplated by the invention.

Device Formation Processes

Figure 6:
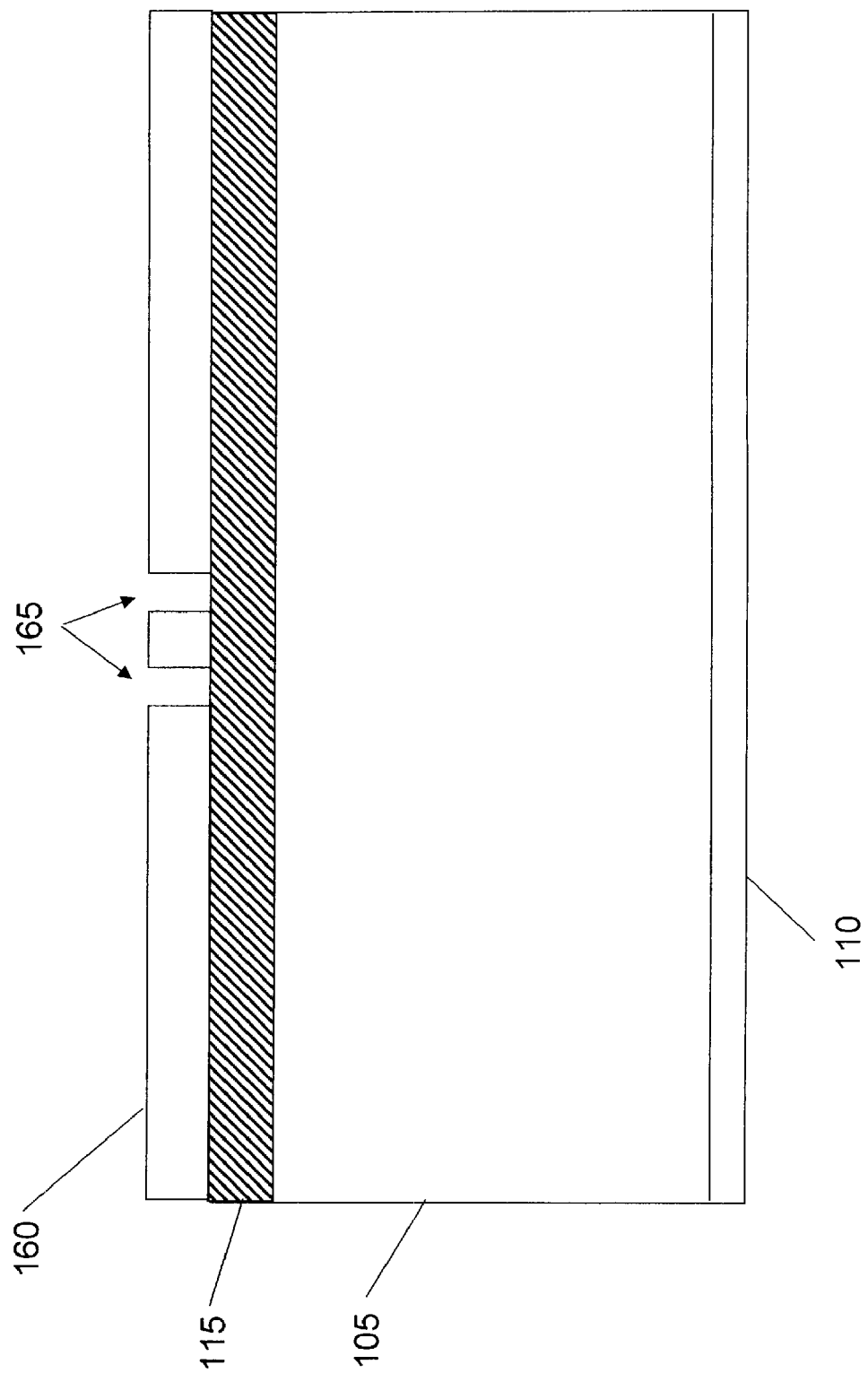
FIGS. 6-9 show processing steps for forming intermediate structures in accordance with the invention.
Figure 8:
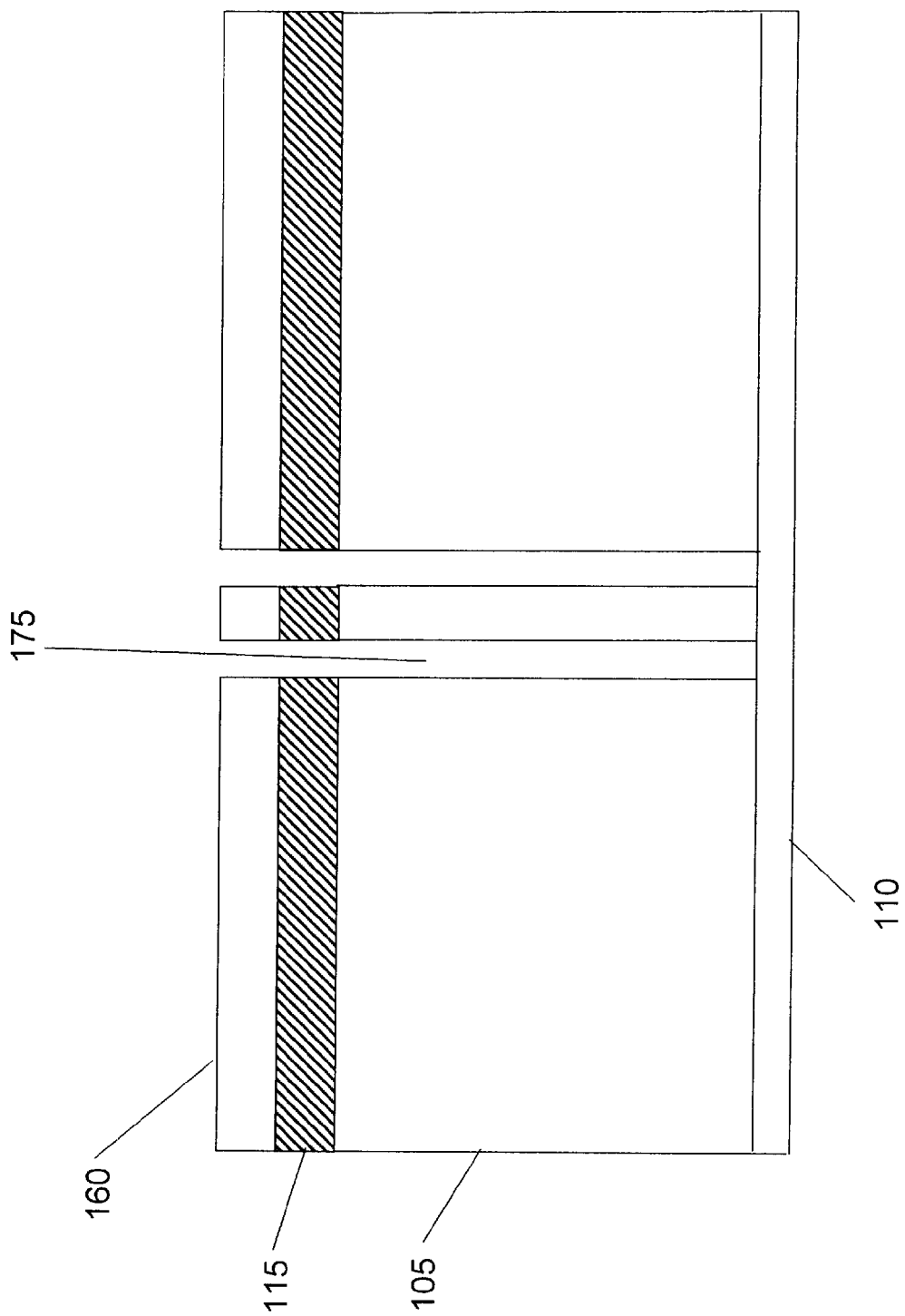
Figure 9:
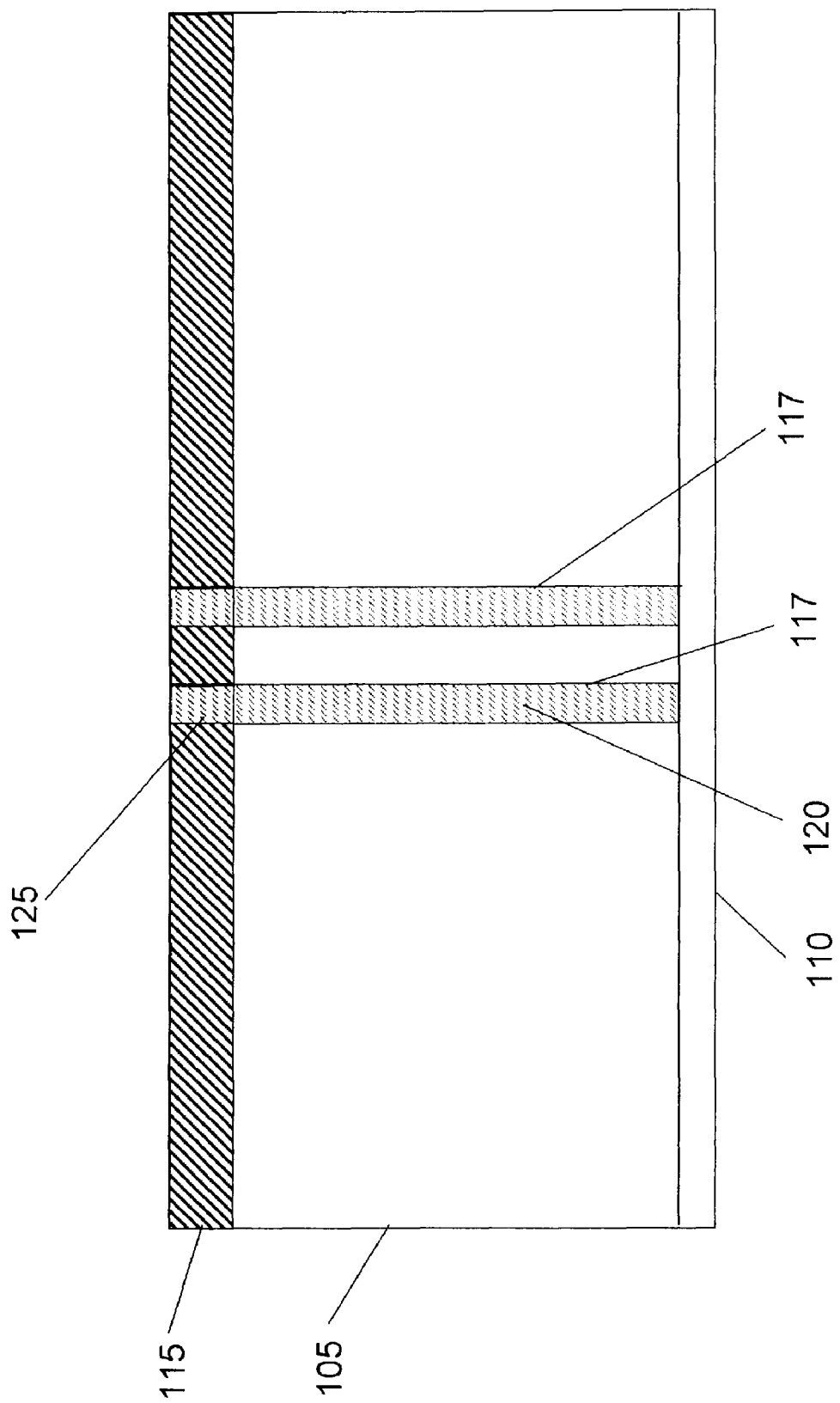
Figure 10:
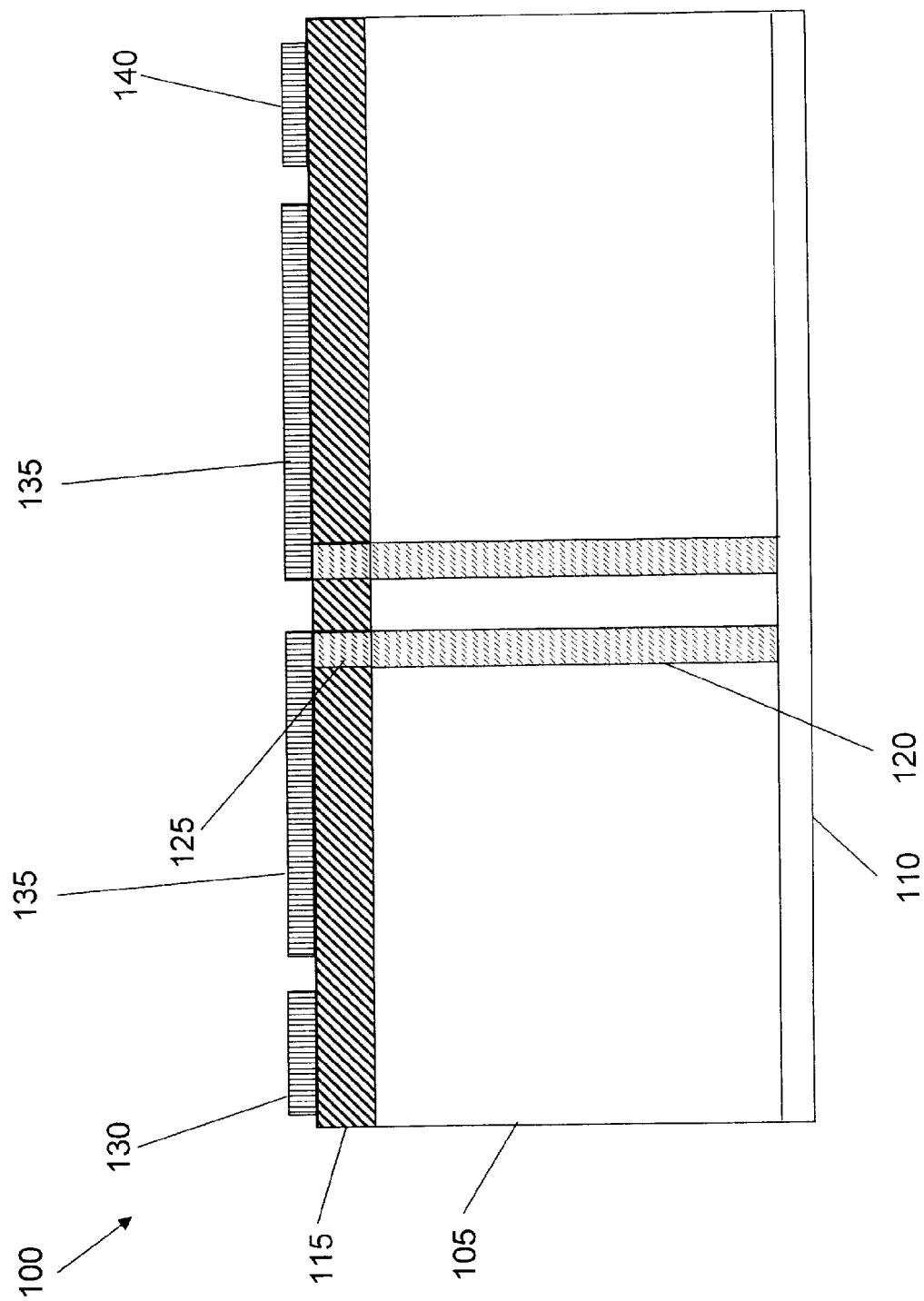
FIG. 10 shows processing steps for forming a final structure in accordance with the invention.

FIGS. 6-9 show process steps for forming a structure shown in FIG. 10 in accordance with an aspect of the invention. FIG. 6 shows a sectional side view of a beginning structure in accordance with the invention. As shown in FIG. 6, the beginning structure comprises a substrate 105, e.g., a Si substrate, of approximately 145 µm to 300 µm in thickness, and having a metal layer 110, e.g., tungsten, copper or aluminum, formed on a bottom side thereof. While not shown in FIG. 6, it should be understood that a device, e.g., transistors, may already be formed in or on the structure of FIG. 6, e.g., formed prior to a BEOL (back end of line) process. Additionally, the substrate 105 has a dielectric layer 115, e.g., $SiO_2$ or low-k material, formed thereon using a conventional deposition process, such as CVD. A masking layer 160 is formed on the dielectric layer 115. The masking layer 160 includes windows 165 formed using well known photolithographic and etching methods in a conventional manner, e.g., using a photoresist. As such, a description of the masking process is not necessary for a person of ordinary skill in the art to practice this particular step.

Figure 7:
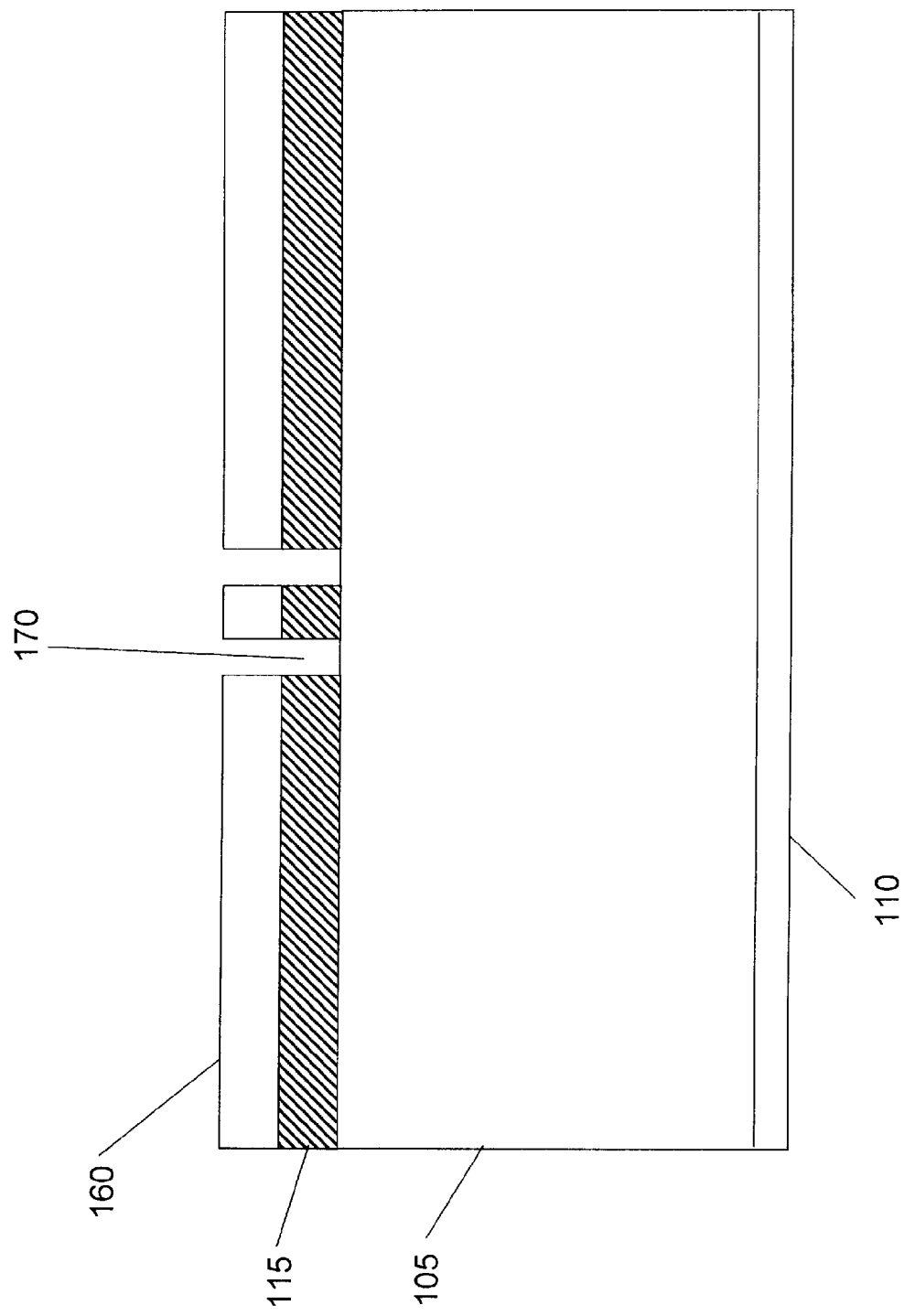

FIG. 7 shows the structure after further processing steps. As shown in FIG. 7, portions of the dielectric layer 115 are etched through the windows 165 to form trenches 170 in the dielectric layer 115. The trenches 170 may be etched using a conventional local etching process, e.g., a reactive ion etch (RIE) process.

As shown in FIG. 8, using the same mask layer 160 (or, in embodiments, a different masking layer), the substrate 105 is etched to form through-silicon trenches 175. The substrate 105 may be etched using a conventional deep etching process, e.g., an anisotropic deep etch or Bosch process.

As shown in FIG. 9, the masking layer 115 has been removed using conventional stripping or etching processes. In embodiments, an insulating liner 117 may be deposited on walls of the trenches prior to the depositing the metal in the trenches 175. More specifically, an oxide may optionally be deposited into the trenches to form an oxide (e.g., insulating) liner 117 in the trenches. Additionally, the trenches are filled with a metal, e.g., tungsten, to form the through-silicon vias 120 and the two contact layers 125. The trenches may be filled with metal using a conventional deposition process, such as CVD or a damascene process.

Additionally, as shown in FIG. 9, the upper surface of the structure may be planarized to remove any excess metal. The structure may be planarized using a conventional planarization process, e.g., a chemical-mechanical polish (CMP).

As shown in FIG. 10, the top side interconnect, comprising each of two inner portions 135, the outer portion 130 and the outer portion 140, may be formed on the dielectric layer 115. Additionally, as shown in FIG. 10, the two inner portions 135 are formed in contact with the two contact layers 125, respectively. In embodiments, the two inner portions 135, the outer portion 130 and the outer portion 140 may be formed of a metal, e.g., aluminum or copper. The two inner portions 135, the outer portion 130 and the outer portion 140 may be formed in a conventional metal deposition process, e.g., a BEOL deposit. As such, a description of the metal deposition process is not necessary for a person of ordinary skill in the art to practice this particular step.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method for forming a through-silicon via bandpass filter comprising:
   forming a substrate comprising a silicon layer;
   providing a metal layer on a bottom side of the silicon layer;
   providing a dielectric layer on a top side of the silicon layer;
   forming a top-side interconnect of the through-silicon via bandpass filter on a surface of the dielectric layer;
   forming a plurality of contacts in the dielectric layer in contact with the top-side interconnect; and
   forming a plurality of through-silicon vias through the substrate and in contact with the plurality of contacts, respectively, and the metal layer.

2. The method of claim 1, wherein the plurality of through-silicon vias comprise one of tungsten and copper.

3. The method of claim 1, wherein the dielectric layer comprises a silicon oxide or a low-k material.

4. The method of claim 1, wherein the plurality of contacts comprise tungsten.

5. The method of claim 1, further comprising:
etching through the substrate and the dielectric layer to form trenches therein; and
depositing a metal in the trenches to form the plurality of through-silicon vias in the substrate and the plurality of contacts in the dielectric layer.

6. The method of claim 5, further comprising forming an insulating liner on walls of the trenches prior to the depositing the metal in the trenches.

7. The method of claim 1, wherein the substrate comprises a thickness between approximately 145 μm and 300 μm.

8. A method for forming a filter comprising:
forming a first and a second through-silicon vias in a substrate, wherein the first and the second through-silicon vias are spaced from one another by a distance $D_{sep}$;
depositing a dielectric layer on the substrate;
forming a first contact and a second contact in the dielectric layer and in contact with the first and the second through-silicon vias, respectively;
forming a first inner portion and a second inner portion on the dielectric layer in contact with the first contact and the second contact, respectively, wherein the first inner portion and the second inner portion each have a length $L_{top}$;
forming a first outer portion and a second outer portion in line with the first inner portion and the second inner portion and respectively spaced from the first inner portion and the second inner portion by a distance $D_{gap}$; and
depositing a metal layer on a bottom side of the substrate, wherein the first and the second through-silicon vias are in contact with the metal layer.

9. The method of claim 8, wherein the first and the second inner portions and the first and the second outer portions comprise one of aluminum and copper.

10. The method of claim 8, wherein the distance $D_{sep}$ is between approximately 5 μm and 20 μm.

11. The method of claim 8, wherein the first inner portion and the second inner portion respectively form lateral inductors.

12. The method of claim 11, further comprising selecting the length $L_{top}$ to determine a filter frequency upper limit of the filter.

13. The method of claim 8, wherein the first through-silicon via and the second through-silicon via respectively form vertical inductors.

14. The method of claim 13, further comprising selecting the distance $D_{sep}$ to determine a filter frequency lower limit of the filter.

15. The method of claim 13, further comprising selecting the distance $D_{sep}$ to determine an insertion loss of the filter.

16. The method of claim 8, wherein the first and the second through-silicon vias form a middle capacitor, the method further comprising selecting the distance $D_{sep}$ to determine at least one of a filter frequency lower limit of the filter and an insertion loss of the filter.

17. The method of claim 8, wherein the first outer portion and the first inner portion form a first capacitor and the second outer portion and the second inner portion form a second capacitor, the method further comprising selecting the distance $D_{gap}$ to provide direct current electrical isolation for the filter.

18. The method of claim 8, further comprising selecting at least one of the distance $D_{gap}$ and the length $L_{top}$ to target a filter frequency of between approximately 60 gigahertz and 94 gigahertz.

19. The method of claim 8, wherein at least one of the length $L_{top}$ is between approximately 100 μm and 300 μm and the distance $D_{gap}$ is between approximately 0.1 μm and 1.5 μm.

20. A method for forming a filter comprising:
forming a first and a second through-silicon vias in a substrate having a thickness between approximately 145 μm and 300 μm, wherein the first and the second through-silicon vias are spaced from one another by a distance $D_{sep}$ of between approximately 5 μm and 20 μm;
depositing a dielectric layer on the substrate;
forming a first contact and a second contact in the dielectric layer and in contact with the first and the second through-silicon vias, respectively;
forming a first inner portion and a second inner portion on the dielectric layer in contact with the first contact and the second contact, respectively, wherein the first inner portion and the second inner portion each have a length $L_{top}$ of between approximately 100 μm and 300 μm;
forming a first outer portion and a second outer portion in line with the first inner portion and the second inner portion and respectively spaced from the first inner portion and the second inner portion by a distance $D_{gap}$ of between approximately 0.1 μm and 1.5 μm; and
depositing a metal layer on a bottom side of the substrate, wherein the first and the second through-silicon vias are in contact with the metal layer,
wherein at least one of the distance $D_{gap}$ and the length $L_{top}$ is selected to target a filter frequency of between approximately 60 gigahertz and 94 gigahertz.

* * * * *